US010802723B1

(12) United States Patent
Grenier et al.

(10) Patent No.: US 10,802,723 B1
(45) Date of Patent: Oct. 13, 2020

(54) APPARATUS AND METHOD FOR FAST-PATH MEMORY OPERATIONS

(71) Applicant: Altera Corporation, San Jose, CA (US)

(72) Inventors: Richard Grenier, San Jose, CA (US); Arif Rahman, San Jose, CA (US)

(73) Assignee: Altera Corporation, San Jose, CA (US)

(*) Notice: Subject to any disclaimer, the term of this patent is extended or adjusted under 35 U.S.C. 154(b) by 742 days.

(21) Appl. No.: 13/779,562

(22) Filed: Feb. 27, 2013

(51) Int. Cl.
*G06F 3/00* (2006.01)
*G06F 3/06* (2006.01)

(52) U.S. Cl.
CPC .................. *G06F 3/0611* (2013.01)

(58) Field of Classification Search
None
See application file for complete search history.

(56) References Cited

U.S. PATENT DOCUMENTS

| | | | |
|---|---|---|---|
| 7,415,723 B2* | 8/2008 | Pandya | H04L 63/0218 370/389 |
| 7,466,357 B2* | 12/2008 | Myojo | 348/333.05 |
| 2004/0215929 A1* | 10/2004 | Floyd et al. | 712/16 |
| 2005/0120110 A1* | 6/2005 | Curran-Gray et al. | 709/224 |
| 2008/0222383 A1* | 9/2008 | Spracklen | G06F 12/1036 711/207 |
| 2012/0079056 A1* | 3/2012 | Turanyi et al. | 709/213 |
| 2013/0074081 A1* | 3/2013 | Cassetti | G06F 17/30985 718/102 |

OTHER PUBLICATIONS

Clive Maxfield, "2D vs 2.5D vs. 3D ICs 101", EE Times, Apr. 8, 2012.*

* cited by examiner

*Primary Examiner* — David Yi
*Assistant Examiner* — Craig S Goldschmidt

(57) ABSTRACT

Embodiments of the present invention provide tightly coupled off-die memory along with an interface bus and smart buffer logic so as to efficiently perform certain frequent or repetitive operations off of a core logic. Embodiments of the present invention relieve the core logic from performing certain repetitive or frequent memory accesses and other operations so as to allow such core logic to perform other more general or varied operations. In this way, the universal interface bus, smart buffer logic, and off-die memory are specially configured to perform certain select frequent and repetitive operations while the core logic may configured to perform other operations so as to provide an improved configuration with increased computational capability and reduced power budget.

26 Claims, 6 Drawing Sheets

APPARATUS AND METHOD FOR FAST-PATH MEMORY OPERATIONS

FIELD OF THE INVENTION

The present invention generally relates to the field of integrated circuits. More particularly, the present invention relates to improved configurations of circuits for performing certain fast-path memory operations.

BACKGROUND OF THE INVENTION

In certain integrated circuit applications, there may exist a number of select fast-path memory operations which occur frequently and repetitively throughout the course of processing. Traditional approaches to access an off-chip memory repetitively and processing the subsequent data on logic/processor die require significant power budget and the performance of such operation is limited by off-chip signal bandwidth and latency.

An example of frequent and repetitive memory operations includes those associated with certain wire-line applications such as packet processing, traffic management, and deep packet inspection. Image and video processing and analytics can also implement a number of select fast-path memory operations which occur frequently and repetitively throughout the course of processing. In these applications, traditional approaches to access an off-chip memory repetitively and processing the subsequent data on logic or processor die require significant power budget and the performance of such operation is limited by off-chip signal bandwidth and latency. For example, in certain applications, approximately 30% of total power budget is allocated to off-chip memory access.

There is a need in the art for a low-power and high-performance solution to frequent and repetitive memory operations such as may be implemented in wire line and image processing applications. There is a further need in the art for off-die memory operations to be tightly coupled to a logic core.

SUMMARY OF THE INVENTION

Among other things, embodiments of the present invention provide tightly coupled off-die memory along with an interface bus and smart buffer logic so as to efficiently perform certain frequent or repetitive operations off of a core logic. Embodiments of the present invention, therefore, relieve the core logic from performing certain repetitive or frequent memory accesses and other operations so as to allow such core logic to perform other, in some case, more general or varied operations. In this way, the universal interface bus, smart buffer logic, and off-die memory are specially configured to perform certain select frequent and repetitive operations while the core logic may configured to perform other operations so as to provide an improved configuration with increased computational capability and reduced power budget.

Embodiments of the present invention can be implemented using various packaging and other techniques. For example, embodiments of the present invention can be implemented in so-called 2.5D (2.5-dimensional) packaging applications. In such an embodiment, an interposer can be advantageously utilized to provided tightly coupled connectivity of the various components of the present invention, including, for example, the universal interface bus, smart buffer logic, core logic, and off-die memory.

Another embodiments of the present invention can be implemented using so-called 3D (three-dimensional) packaging applications. In such an embodiment, through-silicon vias, micro-bumps and other connectivity techniques can be advantageously utilized to provided tightly coupled connectivity of the various components of the present invention, including, for example, the universal interface bus, smart buffer logic, core logic, and off-die memory.

Embodiments of the present invention can be utilized in many applications, including wire line and image processing applications, that implement frequent or repetitive memory access and related computational operations. Examples will be provided further below.

Among other things, embodiments of the present invention provide a tightly-coupled layer of memory hierarchy that can reduce or mitigate off-die memory usage. Indeed, embodiments of the present invention can reduce certain requirements for on-die memory (e.g., SRAM). Embodiments of the present invention can provide savings in cost, power, and silicon footprint. Also, embodiments of the present invention can enhance end-user applications with increased throughput.

These and other embodiments can be more fully appreciated upon an understanding of the detailed description of the invention as disclosed below in conjunction with the attached figures.

BRIEF DESCRIPTION OF THE DRAWINGS

The following drawings will be used to more fully describe embodiments of the present invention.

DETAILED DESCRIPTION OF THE INVENTION

The following description is of certain preferred embodiments presently contemplated for carrying out this invention. This description is made for the purpose of illustrating the general principles of this invention and is not meant to limit the inventive concepts claimed herein.

Figure 1:
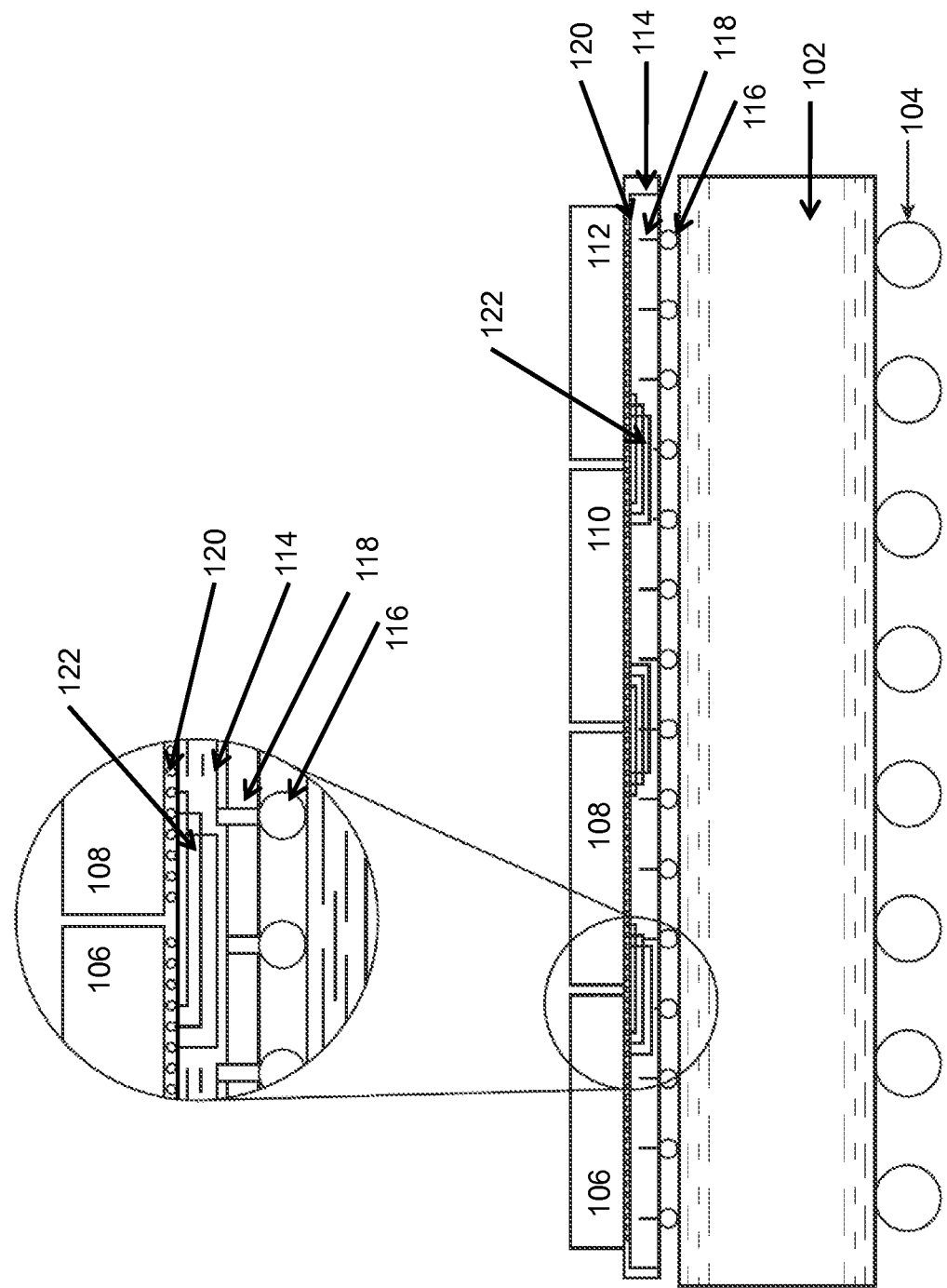
FIG. 1 is a diagram illustrating 2.5D packaging techniques that may be used in embodiments of the present invention.

As will be described further below, embodiments of the present invention can be implemented in so-called 2.5D (i.e., 2.5-dimensional) applications as well as 3D (i.e., three-dimensional) applications. An example of a 2.5D application on which embodiments of the present invention can be practiced is shown in FIG. 1. Among other things, 2.5D applications seek to implement packaging and other techniques that are beyond traditional two-dimensional techniques so as to provide a compact package with increased functionality. For example, shown in FIG. 1 is circuit package 100 that is implemented using 2.5D techniques. As shown, package substrate 102 includes balls 104 that make up a ball grid array for making connections with the circuitry contained in package 100 and other circuitry such as may be connected using a printed circuit board (PCB). Substrate 102 is configured so as to hold and provide interconnections, such as through the use of balls 118, to interposer 114. Moreover, interposer 114 is configured so as to hold and provide interconnections, such as through microbumps 120, to devices 106, 108, 110, and 112. Devices 106-112 can be many types of electronic devices, including, but not limited to, FPGA, SRAM, DRAM, digital signal processors, or other logic devices. Indeed, 2.5D applications can have combinations of many of these and other types of devices as would be known to those of ordinary skill in the art.

In an embodiment, interposer 114 is configured as a passive silicon interposer that may include various layers of metal that are used to connect balls 118 to microbumps 120. In an implementation as a passive silicon interposer, interposer 114 has no transistors within it. Such a configuration may be desirable so as to avoid problems with yields and other issues because a passive silicon interposer can be made more robustly. Also, a passive silicon interposer can be made with low cost semiconductor processing techniques that avoid other high-cost techniques (e.g., laser drilling techniques). Moreover, interposer 114 may further implement through-silicon vias (TSVs) so as to further facilitate interconnections from balls 118 below interposer 114 and microbumps 120 above interposer 114. In an embodiment, balls 104, 118, and microbumps 120 are configured so as to distribute power, ground, and other electrical signals. In still other embodiments, balls 104, 118, and microbumps 120 further provide for the physical integrity of package 100.

While one embodiment of interposer 114 is described, those of ordinary skill in the art will understand that other interposers are possible. For example, other interposers may not be passive silicon interposers and may have active devices on them. The description of the 2.5D application of FIG. 1 is provided as an example only and is not intended to be limiting. Indeed, those of ordinary skill in the art will appreciate that many variations are possible.

Figure 2:
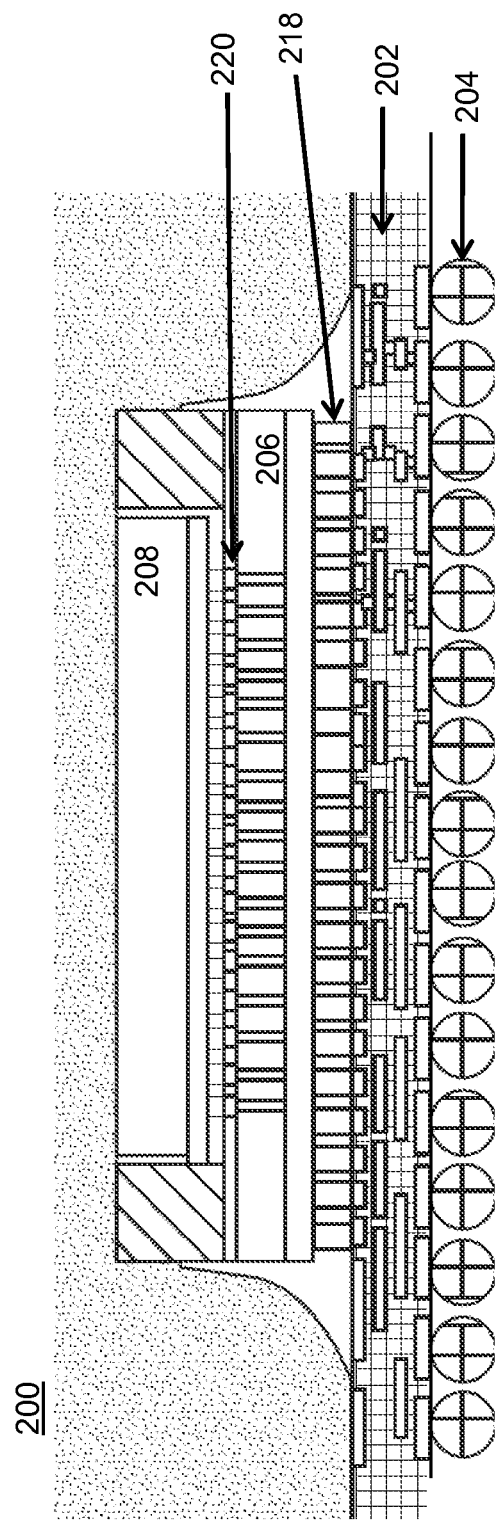
FIG. 2 is a diagram illustrating 2.5D packaging techniques that may be used in embodiments of the present invention.

An example of a 3D application on which embodiments of the present invention can be practiced is shown in FIG. 2. Among other things, 3D applications may seek to implement packaging, semiconductor processing, and other techniques that are beyond traditional two-dimensional techniques while also avoiding the need for an interposer so as to provide a package with densely integrated circuit dies and their circuitry.

As shown in FIG. 2, package substrate 202 includes balls 204 that make up a ball grid array for making connections with the circuitry contained in package 200 and other circuitry such as may be connected using a printed circuit board (PCB). Substrate 202 is configured so as to hold and provide interconnections such as through the use of balls 218 to device 206. Moreover, device 206 is configured so as to hold and provide interconnections such as through microbumps 220 to devices 208. Devices 206 and 208 can be many types of electronic devices, including, but not limited to, FPGA, SRAM, DRAM, digital signal processors, or other logic devices. Indeed, 3D applications can have combinations of many of these and other types of devices. Also, several devices 206 as well as several devices 208 may be included as part of package 200. Moreover, more levels of devices (e.g., more than two) can also be implemented in package 200.

In an embodiment, device 206 (as well as device 208) is an active device as distinguished from the passive silicon interposer such as in an embodiment of FIG. 1. Device 206 (as well as device 208) may include various layers of metal that are used to connect balls 218 to microbumps 220. Moreover, Device 206 (as well as device 208) may further implement through-silicon vias (TSVs) so as to further facilitate interconnections from balls 218 below logic device 218 and microbumps 220 above logic device 218. In an embodiment, balls 204, 218, and microbumps 220 are configured so as to distribute power, ground, and other electrical signals. In still other embodiments, balls 204, 218, and microbumps 220 further provide for the physical integrity of package 200.

The description of the 3D application of FIG. 2 is provided as an example only and is not intended to be limiting. Indeed, those of ordinary skill in the art will appreciate that many variations are possible.

Although embodiments of the present invention are herein described as being implemented using 2.5D and 3D techniques, the scope of the present invention is not so limited. Indeed, embodiments of the present invention can be implemented in other existing technologies such as flip-chip packages. Also, the present invention can be implemented in other packaging techniques as may be developed in the future.

Embodiments of the present invention provide advantages in applications that incorporate off-die memory sub-systems that seek to be tightly coupled to one or more logic cores (e.g., FPGAs, ASICs, ASSPs, or DSPs). Moreover, embodiments of the present invention provide advantages in applications that make frequent and repetitive use of fast-path memory operations. In an embodiment, the universal interface block acts as a front-end IO driver/receiver. But rather that burdening a logic core for certain fast path memory operations, embodiments of the present invention provide a specialized universal interface block that is tightly coupled to memory (e.g., SRAM, SDRAM, etc.) and is configured to independently manage and execute certain fast-path memory operations.

Figure 3:
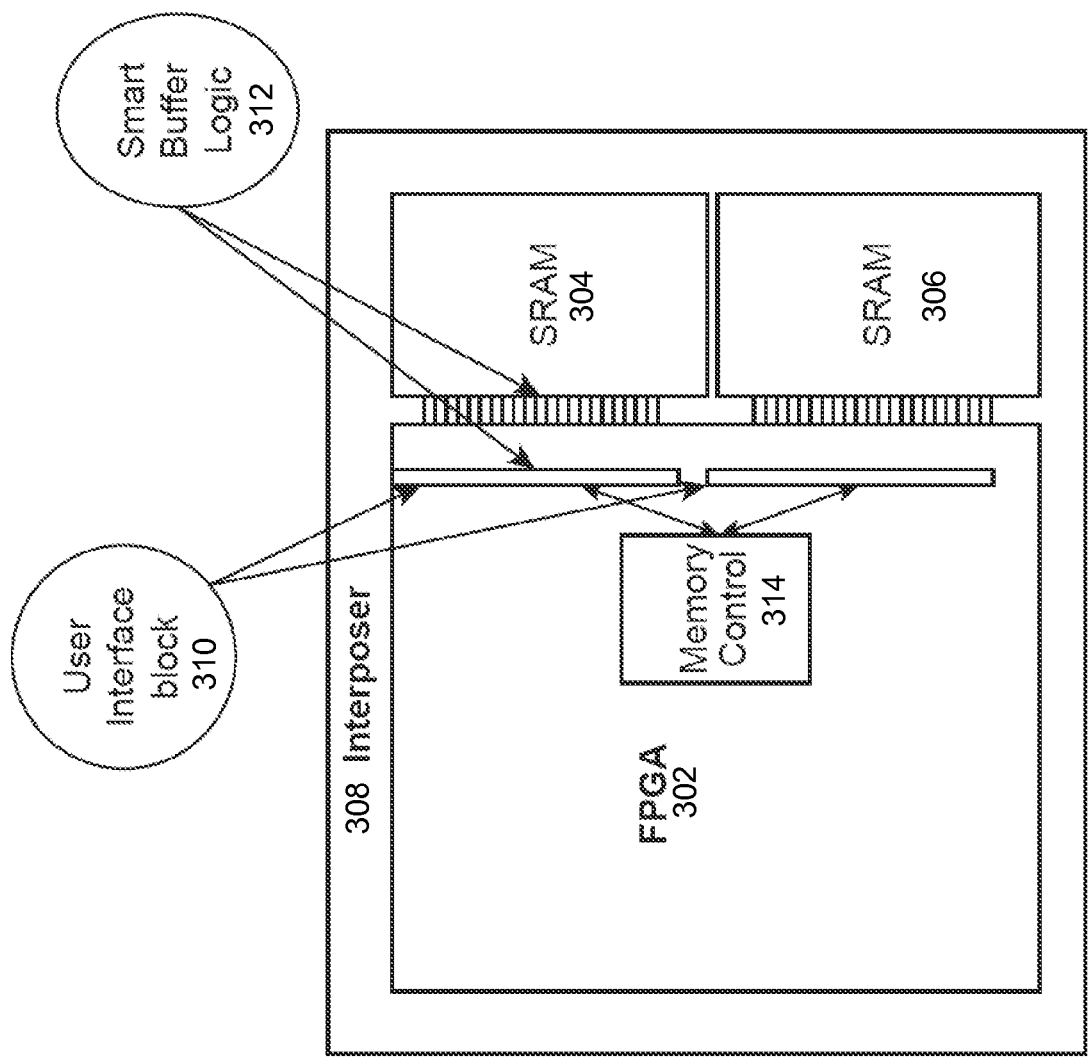
FIG. 3 is a block diagram of an embodiment of the present invention as implemented using 2.5D packaging techniques.

Shown in FIG. 3 is a block diagram of an embodiment of the present invention that is implemented using 2.5D techniques. As shown, Field Programmable Gate Array (FPGA) 302 is a logic core that is coupled to off-die memory (e.g., SRAM) 304 and 306 through silicon interposer 308. In an embodiment, the interposer-based memory 304 and 306 effectively adds a layer of memory hierarchy that complements existing memory structures including FPGA LUT registers and embedded SRAM blocks. This layer of hierarchy offers substantial capacity over traditional embedded SRAM elements with, in some situations, only slightly reduced throughput. In embodiments of the present invention, the off-die interposer memory 304 and 306 can mitigate the need for off-chip discrete memory components such as more expensive QDR-II or RLDRAM-III memory. In other embodiments, an added benefit is achieved by reducing prime material cost, PCB area footprint, and total system power, among other things.

In an embodiment of the present invention, universal interface block (UIB) 310 is implemented as an interface between a logic device such as FPGA 302 and off-die interposer memory 304 and 306. In an embodiment, UIB 310 interfaces with core logic such as FPGA 302 through memory control circuit 314 that is configured to control the flow of memory information between memory 304/306 and FPGA 302.

In an embodiment, UIB 310 can include low-level IO buffers that are used for clocking and signal handshaking, among other things. Also, UIB 310 may include appropriate mux/demux data-steering logic required for command, address, and read or write data transfers as may be needed in certain memory and computationally intensive operations. In an embodiment, UIB 310 is implemented in hard IP (HIP). In another embodiment, however, UIB 310 is implemented in the soft fabric of FPGA 302, for example. Still other embodiments can be implemented as a hybrid of hard IP and soft fabric.

In an embodiment, UIB 310 acts as a front-end IO driver/receiver interface to micro-bump IOs (see FIGS. 1 and 2) that bind to the memory device (e.g., SRAM 304, 306) signal IO interconnects across a passive silicon interposer 308 (see FIG. 1) or across and through other circuitry and packages (see FIG. 2). In another embodiment, UIB 310 groups logical "bundles" of memory IOs into a plurality of unique channels, effectively enabling connectivity to multiple memory (e.g., SRAM) blocks, each of which may be individually accessed by memory control 314 that is substantially dedicated to these blocks.

So as to manage and execute certain fast-path memory operations, UIB 310, according to an embodiment of the present invention, includes specially configured smart buffer logic 312. In an embodiment of the present invention, smart buffer logic 312 is particularly configured to manage and execute a limited number of fast-path memory operations. For example, in embodiments of the present invention, smart buffer logic 312 includes specially configured logic that can independently manage and execute certain fast-path memory operations associated with computing certain wire-line statistics. More particularly, certain embodiments of the present invention are configured to manage and execute wire-line statistics associated with deep packet inspection, expedited head and tail pointer management, automated IP/TCP error detection and correction, and pattern matching. Certain further details of these embodiments will be provided further below.

Through the use of UIB 310 with its configured smart buffer logic 312, FPGA 302 and SRAM 304 and 306 are tightly coupled as shown in FIG. 3 according to an embodiment of the present invention. More generally, however, embodiments of the present invention provide a smart buffer logic that tightly couples core logic to off-die memory. For example, as further shown in FIG. 3, smart buffer 312 can be included within memory 304 or 306 so as to appropriately manage and execute certain fast-path memory operations without burdening the core logic (e.g., FPGA 302) with such tasks. In yet another embodiment, smart buffer 312 can be implemented in a separate die such as another interposer-based die.

Embodiments of the present invention, therefore, add value to end-user design capability for high-performance applications such as memory-intensive applications. For example, embodiments of the present invention reduce the requirements for on-die memory (e.g., on-die SRAM) by providing tightly coupled and enhanced off-die memory. In embodiments of the present invention, other off-die memory use (e.g., not interposer-based memory 304 and 306) can be substantially reduced or mitigated. Also, embodiments of the present invention, provide for reduced power, reduced silicon footprint, and reduced cost.

Through the implementation of UIB 310 and smart buffer logic 312 that tightly couples memory 304 and 306 to the logic core (e.g., FPGA 302), the logic core is relieved of performing certain frequent or repetitive tasks. In being so relieved and because UIB 310, smart buffer logic 312, and memory 304/306 are preferably configured to efficiently perform the frequent and repetitive tasks, the combined circuitry can operate more efficiently. For example, because the logic core is relieved of these frequent and repetitive tasks, power consumption can be substantially reduced. Also, bus traffic can be reduced so as to improve signal bandwidth and latency.

The embodiment of FIG. 3 can be implemented in the 2.5D application as shown in FIG. 1 where, among other things, the logic core and memory can be implemented as devices 106-112. Moreover, UIB 310 and smart buffer logic 312 can be implemented within a logic core having broader capability, or it can be implemented as one or more devices (e.g., devices 106-112 as shown in FIG. 1) or it can be implemented within one or more off-die memory devices.

Similarly, the embodiment of FIG. 3 can be implemented in the 3D application as shown in FIG. 2 where, among other things, the logic core and memory can be implemented as devices 206-208. Moreover, UIB 310 and smart buffer logic 312 can be implemented within a logic core having broader capability, or it can be implemented as one or more devices 206-208 or can be implemented within one or more off-die memory devices.

Embodiments of the present invention include applications where fast-path memory operations occur repetitively and frequently during the operation of a device. For example, embodiments of the present invention are implemented for use in wire-line applications such as packet processing, traffic management, deep packet inspection, and other telecommunications applications. Still other applications include video processing and analytics that implement specialized fast-path memory operations. Many other applications are, however, possible as would be understood by one of ordinary skill in the art upon understanding the present teachings.

In an embodiment of the present invention, algorithms and other functionality within smart buffer logic 312 are applied to off-die memory sub-systems that are tightly coupled. When implemented at either the UIB or the memory, embodiments of the present invention reduce the end-user logic complexity, total system power, and resultant latency associated with frequently encountered memory references such as for wire-line and similar application-specific use.

Embodiments of the present invention can be implemented with off-die memory subsystems or embedded user-interfaces to such memory subsystem. In addition, embodiments of the present invention are generally agnostic to, among other things, the memory type (e.g., SRAM, SDRAM), the number of off-die memory elements, the memory bandwidth and latency, the memory address space, the memory data-path width and implementation (e.g., common-IO vs. split-IO), the number of memory input/output ports or channels per memory device, the type of memory interface ports or channels (e.g., single-port, multi-port, or true dual-port), the command/address/RW control protocol or signaling method (e.g., parallel or serial), the memory process technology or user-interface process technology, the number and type of core devices (e.g., ASIC, ASSP, FPGA), and the memory or core physical integration topology (e.g., side-by-side, 2.5D, or 3D stacked TSV).

To illustrate the broad applicability of the present invention, various embodiments will be described. The examples described below implement one or more off-die memory (e.g., SRAM) elements that are tightly coupled to an FPGA device as an example of a general logic device. In certain of the examples below, the FPGA device includes one or more UIBs and smart buffer logic according to embodiments of the present invention. For example, in certain embodiments the UIB and smart buffer logic implement user-controller logic that is embedded within the soft fabric of an FPGA that is coupled to the external SRAM elements. In certain of the embodiments described below, the UIB signal IO also provides physical connectivity to off-die memory elements through, for example, an interposer (e.g., passive silicon interposer) that closely binds the UIB, smart buffer logic, and memory to the FPGA core.

Certain advantages for adding smart-buffer attributes for off-die interposer memory is illustrated in the examples described below. In each of these examples, properties of embodiments of the invention are identified as embodied within either the UIB interface (as seen by the user-defined memory controller logic) or within the actual memory. Within the UIB interface, smart buffer logic functionality can be implemented in soft (e.g., in FPGA fabric) or hard circuitry (e.g., in ASIC, custom logic, or metal programmable circuitry). Alternatively, smart buffer logic functionality can be implemented in soft or hard implementations within the memory die.

Note that in certain embodiments to be described below, only one unique transaction per interface is executed at a time. The teachings of the present invention, however, can be extended to multiple transactions. For example, other embodiments of the present invention implement multiple, and potentially unique, transactions that can be queued or simultaneously dispatched to multiple memory interfaces. These and other embodiments can be understood by those of ordinary skill in the art upon understanding the present disclosure including its various examples.

Note that in certain of the embodiments described below, interfaces are provided to the UIB for clock, address, R/W, CS/CS*, and data memory controller information among other things. Also, in certain embodiments, additional buses are provided such as an additional command bus and status bus, each of a chosen width as appropriate for a given application. When implemented, such buses can be configured to communicate application-specific memory instructions (e.g., controller issued instructions). Moreover, such buses can allow for acquiring memory completion status information (e.g., busy, acknowledge, carry-overflow, or valid compare). Also, the timing and the syntax associated with unique commands, as well as their completion status format, can be user-defined.

The incremental complexity of logic added to the UIB and off-die memory to facilitate smart-buffer functionality can vary according to the chosen implementation. Other factors that can affect complexity include the scope of smart buffer attributes that are implemented and the application-specific requirements of the implemented smart buffer. As would be understood by those of ordinary skill in the art upon understanding the present disclosure, not all of the suggested smart-buffer properties described below need be implemented. Moreover, many others would be obvious to one of ordinary skill in the art upon understanding the present disclosure.

An embodiment of the present invention is implemented for wire-line applications. In wire-line applications such as packet processing, various statistics are gathered for received (ingress) traffic. These statistics are typically acquired from the MAC layer and are stored in dedicated local buffers, which are periodically reviewed (out of band) by a local management processor in the control plane. Examples of wire-line statistics may be any one or more of the following: VLAN frame type, number of packets targeting a specific destination address, number of multi-cast packets from a given source, number of jumbo frames received, or number of CRC errors.

Statistics are vital for the management processor to monitor and evaluate network traffic patterns, capacity limits, traffic throughput, and port health, among other things. A number of additional statistics may also be gathered, e.g., in-band and at line-rate, by the network processor elements for Layer-3 (Network Layer) provisioning in order to police traffic and potentially react to and mitigate Denial of Service (DOS) attacks that would be disruptive to network throughput.

In a wire-line application, the various statistical event types are typically stored within a fixed address space in a dedicated buffer. As an event of interest is detected, it is counted by adding one to the current event count associated with the statistic of interest. In an application, the memory operation that must be executed is: read from the current event count (statistic address), increment the contents at that address by one, and then store the newly computed sum back into the associated memory location. A statistical event is, therefore, updated (e.g., counted) by executing an atomic read-modify-write transaction in real-time.

In traditional implementations, certain of the above wire-line processing makes extensive use of fast-path memory operations that can substantially burden a logic core. For example, traditional approaches to access an off-chip memory repetitively and processing the subsequent data on logic/processor die requires significant power budget. Also, the performance of such operations is limited by off-chip signal bandwidth and latency. In certain applications, approximately 30% of total power budget is allocated to off-chip memory access.

An embodiment of the present invention makes use of a UIB and smart buffer logic that is closely coupled to memory. For example, certain embodiments include a UIB with processing functionality for wire line applications that is closely coupled to interposer-based SRAM (see FIG. 3).

In a wire-line application, for any given received packet, there may be a plurality of statistical events that must be updated at line rate. For a 100 Gigabit per second Ethernet switch, the packet line rate may be as high as 150 million packets per second (6.7 nsec. per packet), with up to six unique statistics values to update in real-time. For example, at least 900 million read/modify/write transactions can be required to maintain statistics coherence with the offered traffic load. In a traditional application where a read operation from off-die SRAM may consume two cycles at 500 Mhz (4 nsec), the addition cycle (2 nsec) and the two-cycle store (4 nsec), the total update transaction cost per statistic is 10 nsec. An embodiment of the present invention that implements a universal interface block with tightly coupled interposer-based SRAM provides substantial improvements.

For example, in an embodiment, tightly coupled memory 304/306 (e.g., interposer-based SRAM), a universal interface block 310, and smart buffer logic 312 are provided with functionality that supports controller-issued commands that invoke read/modify/write operations that are necessary for computing wire-line statistics. In an embodiment, a memory controller 314 dispatches to universal interface block 310 and smart buffer logic 312 a specific command identifier and an associated address. In this way, read/modify/write operations can be executed transparently and apart from the controller logic.

More particularly, in an embodiment, wire-line operations can be executed within the context of universal interface block 310, smart buffer logic 312, and tightly coupled memory 304/306 without substantially interfering or burdening on-board logic (e.g., FPGA 302) and other memory. In this way, on-board logic and its associated memory are liberated to perform other functions. While operating substantially separately, a command protocol is implemented in an embodiment of the present invention for universal interface block 310 and smart buffer logic 312 so as to provide signals such as interface busy for the duration of transaction execute times or an acknowledge signal upon completion the execution of certain commands. Other command protocols could also be implemented so as to meet the needs of the operations be executed.

In another embodiment, UIB 310 and smart buffer logic 312 are provided with tightly-coupled memory so as to provide for deep packet inspection (DPI). DPI is a form of computer network packet filtering that examines certain packet information such as the packet header or data fields of a packet at an arbitrary point in the packet forwarding path (e.g., ingress or egress direction). DPI is useful for the discovery and notification of viruses, worms, spam, non-compliance to a specific protocol, or denial of service attacks for example. In DPI, when certain search criteria are met, the packet in question can be forwarded to a processor for further inspection (e.g., designated packet buffer), tagged for rate limiting downstream, routed or copied to a unique destination address (port mirroring), or filtered. In this way, DPI provides a line-rate hardware mechanism for network security beyond the traditional methods used in software firewalls.

In practice, search strings as implemented in DPI can be of arbitrary length and are compared to a database of pre-existing search keys of equal or greater length such that an exact string match may be deterministically identified and signaled for stateful packet classification. DPI, therefore, can be computationally intensive and may require substantial use of memory. In traditional applications, DPI can use substantial computing resources that cannot be used for other computations. An embodiment of the present invention that implements a universal interface block and smart buffer logic with tightly coupled interposer-based memory provides substantial improvements.

In an embodiment, tightly coupled memory 304/306 (e.g., interposer-based SRAM) of FIG. 3, universal interface block 310, and smart buffer logic 312 are provided with functionality that supports controller-issued commands that invoke read/modify/write operations that are necessary for performing DPI. For example, a universal interface block 310 and smart buffer logic 312 are provided with a smart buffer attribute that includes one or more search keys that are retained for the purpose of exact-match notification. In such an embodiment, as packets are received and while DPI is engaged in universal interface block 310, memory controller 314 copies an arbitrary number of packet data words (e.g., header and payload) to an off-die memory 304/306 where the search attributes have been pre-initialized. In such an embodiment, the UIB and smart buffer logic are configured to store the write data to a local buffer as instructed and would also compare one or more pre-initialized keys to each data element as it is received from the controller. Variable-length strings can also be compared (in order) to a transmitted search key string for arbitrary length searches. In addition, multiple comparator strings can be initialized for concurrent, parallel search on each element in real time, thereby allowing multiple search rules to be deployed. In an embodiment, rule depth is substantially bounded only by hardware implementation. In a further embodiment, the exact match criteria can be programmable for one or multiple search hits.

In this type of embodiment, the universal interface block and smart buffer logic can further be configured to notify external hardware (e.g., such as through an interrupt message) using a signal that indicates that one or more search criteria have been met. The status of the search results can be stored at a pre-initialized buffer address and later read back through a standard memory read operation. Among other things, a universal interface block and smart buffer logic according to an embodiment of the present invention has a mechanism with programmable search properties that simplifies the end-user logic design while also providing traditional packet storage and retrieval services expected from a general purpose memory.

Embodiments of the present invention can also be implemented in traffic management applications. For example, in certain traffic management applications, queue memory pointers are required to keep track of various flows or classes being serviced. The queue manager maintains traffic queues that are pointers to the packet data that is typically stored in external DDR SDRAM or RLDRAM memory. Also, a separate queue is maintained for each traffic class or traffic flow.

Figure 4:
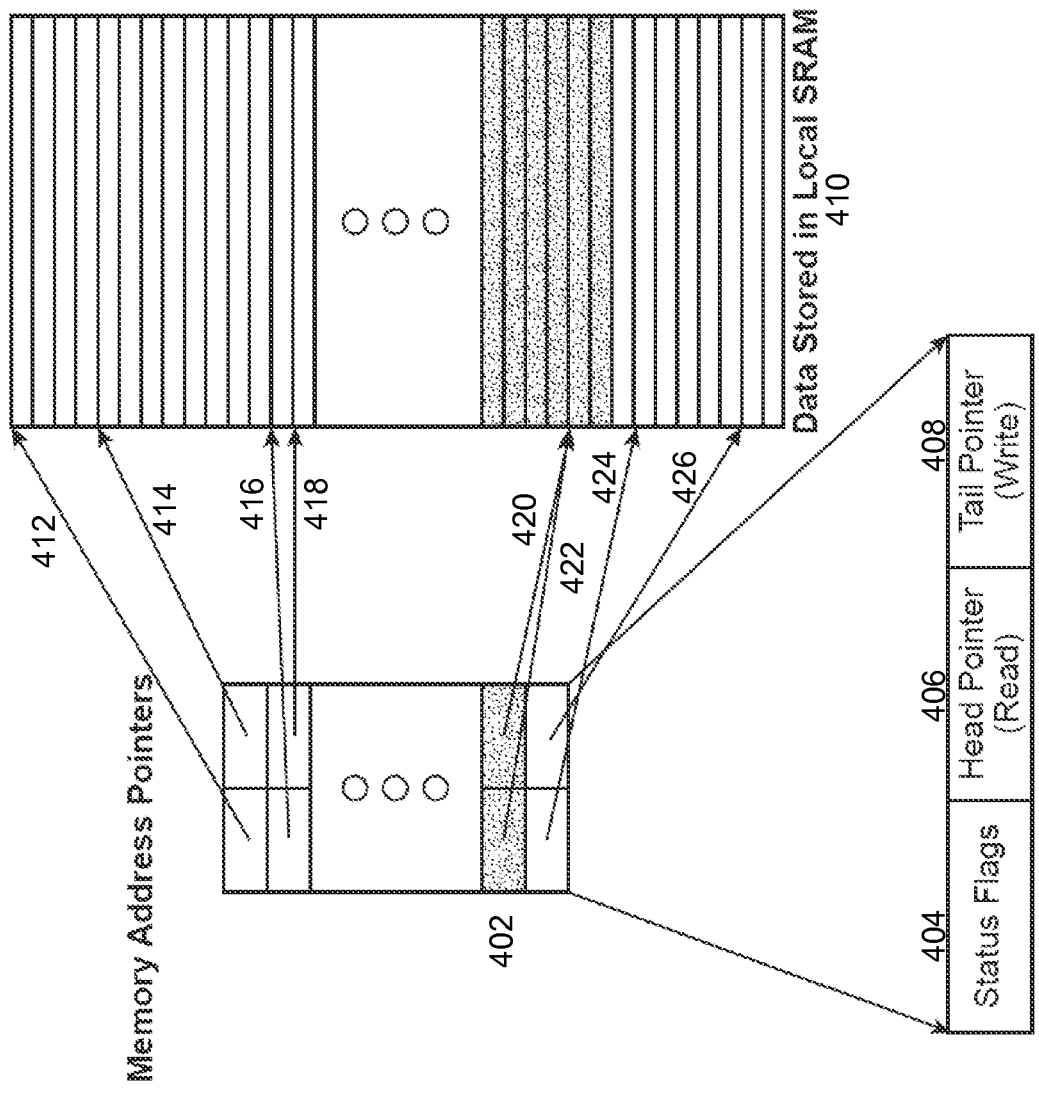
FIG. 4 is a block diagram illustrating certain memory address pointer operations that can be advantageously performed using embodiments of the present invention.

Shown in FIG. 4 is a block diagram for memory address pointers 402. As shown, for queue management, a low-latency memory block 410 is allocated for pointer storage, with each address mapped to an external DRAM memory location. In certain embodiments, addresses are dynamically mapped using a link-list structure or statically allocated by partitioning the external memory into fixed-size blocks 404, 406, and 408. For exemplary purposes, consider an off-die SRAM buffer organized as 4096 queues×128 frames/queue× 64B/frame, which would have a total buffer capacity of 32 MB (i.e., 8192 bytes×4096 queues). If the pointer organization allocates the lower 4096 SRAM addresses as pointers, each of 64 bits wide (e.g., 12b status+26b head pointer+ 26b tail pointer), then the lower 32 Kbytes would be dedicated as descriptors with a substantial remainder of the SRAM available for actual frame storage.

In an embodiment of the present invention, a tightly coupled memory 304/306 (e.g., interposer-based SRAM), UIB 310, and smart buffer logic 312 are provided with functionality that supports expedited head and tail pointer management. In such an embodiment, a UIB 310 is provided with a control bit within a command field. When the control bit is set, a smart buffer attribute traps the descriptor point read or write reference and either automatically fetches the next frame associated with a head-pointer read address (then resets an implemented valid status bit), or stores the next frame write-data associated with a tail pointer write address (then sets a frame valid status bit). In such an implementation, with the control bit set to false, read and write activity to memory locations (e.g., SRAM locations) within the predefined descriptor address range (e.g., 0x0 through 0x3FFF) are interpreted as standard descriptor references with normal memory read or write behavior for such addresses. In a further embodiment, the command operand is extended to include frame count or burst length fields in order to facilitate higher bandwidth data transfers.

An embodiment of the present invention with the described smart-buffer attributes of universal interface block 310 provides substantial advantages over traditional techniques by effectively collapsing the use of local SRAM for descriptor references and external SDRAM for actual buffer storage and retrieval. Because a substantial operations are performed off die, such as in an off-die interposer SRAM as shown in FIGS. 1 and 3 or in off-die SRAM as shown in FIG. 2, it also reduces latency and simplifies the end-user control logic. An implementation of this embodiment is achieved using, among other things, the universal interface block 310, smart buffer logic 312, and off-die memory 304/306 as well as a finite state machine in conjunction with a set of counters as would be known to one of ordinary skill in the art.

Embodiments of the present invention can also be implemented in automated IP/TCP error detection and correction. For example, a frame check sequence (FCS) field of an Ethernet packet is based on CRC calculations and is typically performed at the MAC layer. For network layer IP, however, error detection uses a checksum provided by dedicated hardware. For each received Ethernet frame, the computed checksum provided by the source is sent along with the packet. The packet integrity is verified on the receiving end by computing the checksum for the received packet and comparing the computed result with the original received checksum contents. A packet is then considered error free if there is an exact match of the checksum.

An IPv4 header uses a 16-bit checksum of the header, which is the ones complement sum of 16-bit words in the header. A checksum calculation for IPv4 assumes the included IPv4 checksum field is zero. In contrast, for TCP the checksum field in the TCP header is also calculated by simple 16-bit ones complement sum of all 16-bit words in both header and payload (with last-byte padding if the number of bytes in summation is odd), and also assumes the included TCP checksum field is zero. In traditional applications, automated IP/TCP error detection and correction can use substantial computing resources that cannot otherwise be used for other computations. An embodiment of the present invention that implements a universal interface block and smart buffer logic with tightly coupled memory (e.g., interposer-based SRAM) provides substantial improvements.

In an embodiment of the present invention, on the receive (ingress) side, a universal interface block 310 and smart buffer logic are provided with smart-buffer functionality that automatically computes IPv4, IPv6, or TCP checksums for received Ethernet frames that are stored. Subsequently, notification can be provided to the user-logic of any checksum failures. On the transmit (egress) forwarding path, a universal interface block is provided with a smart-buffer functionality that re-computes checksums on revised headers or payloads and automatically inserts the appropriate checksum contents prior to forwarding. This embodiment of the present invention further provides advantages over traditional approaches by offloading network layer checksum error detection and correction tasks from the end-user and complements the existing fast-path packet storage and retrieval mechanisms. Whereas such operations could substantially burden a traditional application, embodiments of the present invention relieve on-die circuitry of these repetitive operations so that the on-die circuitry and memory can be better or more appropriately allocated to other operations.

Embodiments of the present invention can also be implemented in pattern matching applications. Pattern matching is a common function in image and video processing and is also widely used in target detection for radar and infrared applications. In a traditional pattern matching application, a template (e.g., a two dimensional image) is sought to be matched against other images.

Figure 5:
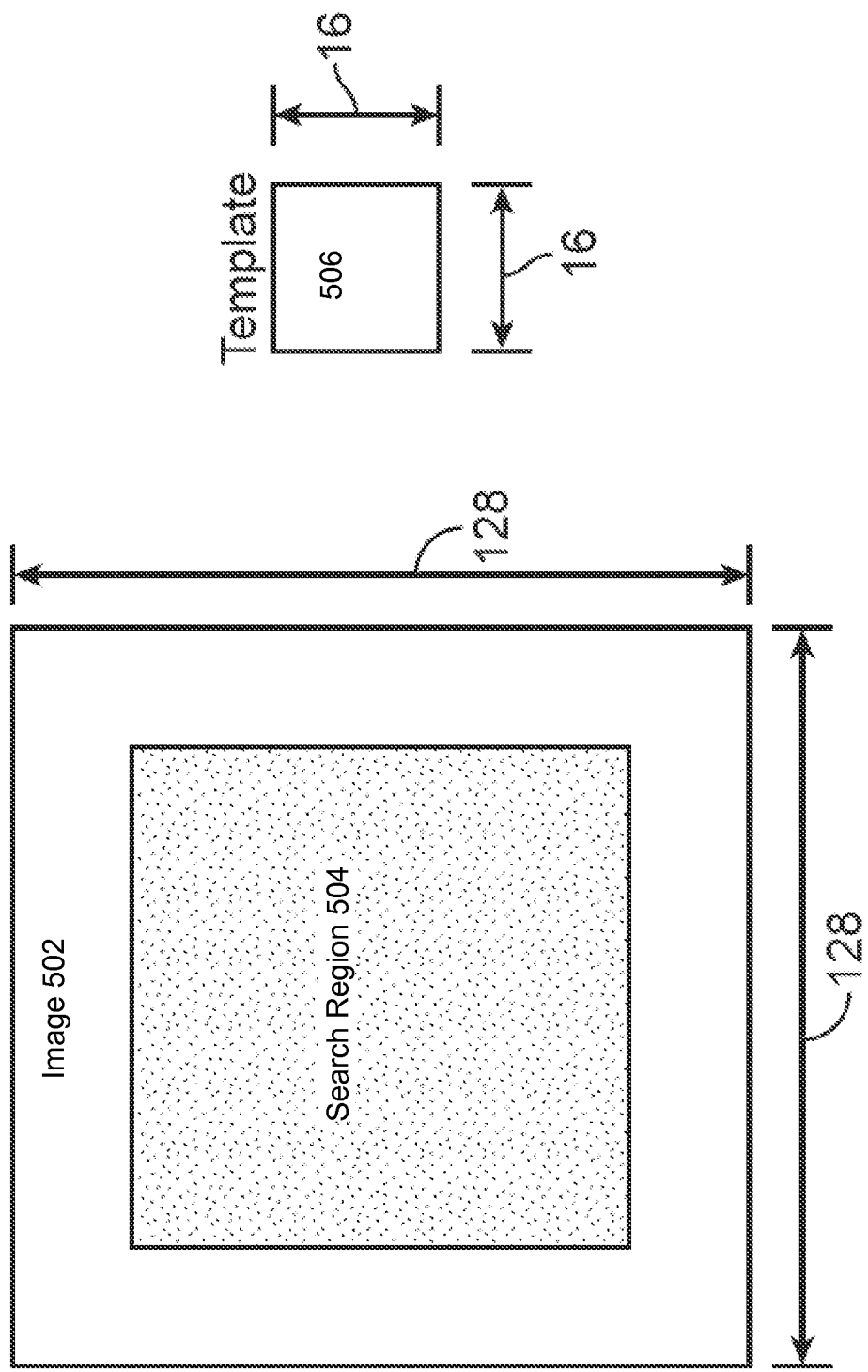
FIG. 5 is a block diagram illustrating certain image processing operations that can be advantageously performed using embodiments of the present invention.

Shown in FIG. 5 is a diagram that assists in understanding an automated target detection algorithm. As shown, an image 502 that is 128 pixels by 128 pixels includes a search region 504 that may be smaller than image 502 within which a pattern is sought to be matched. For example, template 506 is a 16 pixel by 16 pixel pattern that is sought to be matched within search region 504. In a traditional application, a pattern matching algorithm includes many repetitive addition, subtraction, division, and comparison operations that are executed on-die.

Pattern matching applications can use substantial computing resources that cannot otherwise be used for other computations. An embodiment of the present invention implements a universal interface block and smart buffer logic with tightly coupled memory (e.g., interposer-based SRAM) that provides substantial improvements.

In an embodiment, tightly coupled memory (e.g., interposer-based SRAM) and a universal interface block are provided with smart buffer functionality that supports the necessary pattern matching commands along with the image template, dispatched from an FPGA, for example, that initiates a series of fast pattern matching functions as well as indications and feedback regarding whether a pattern was detected.

Figure 6:
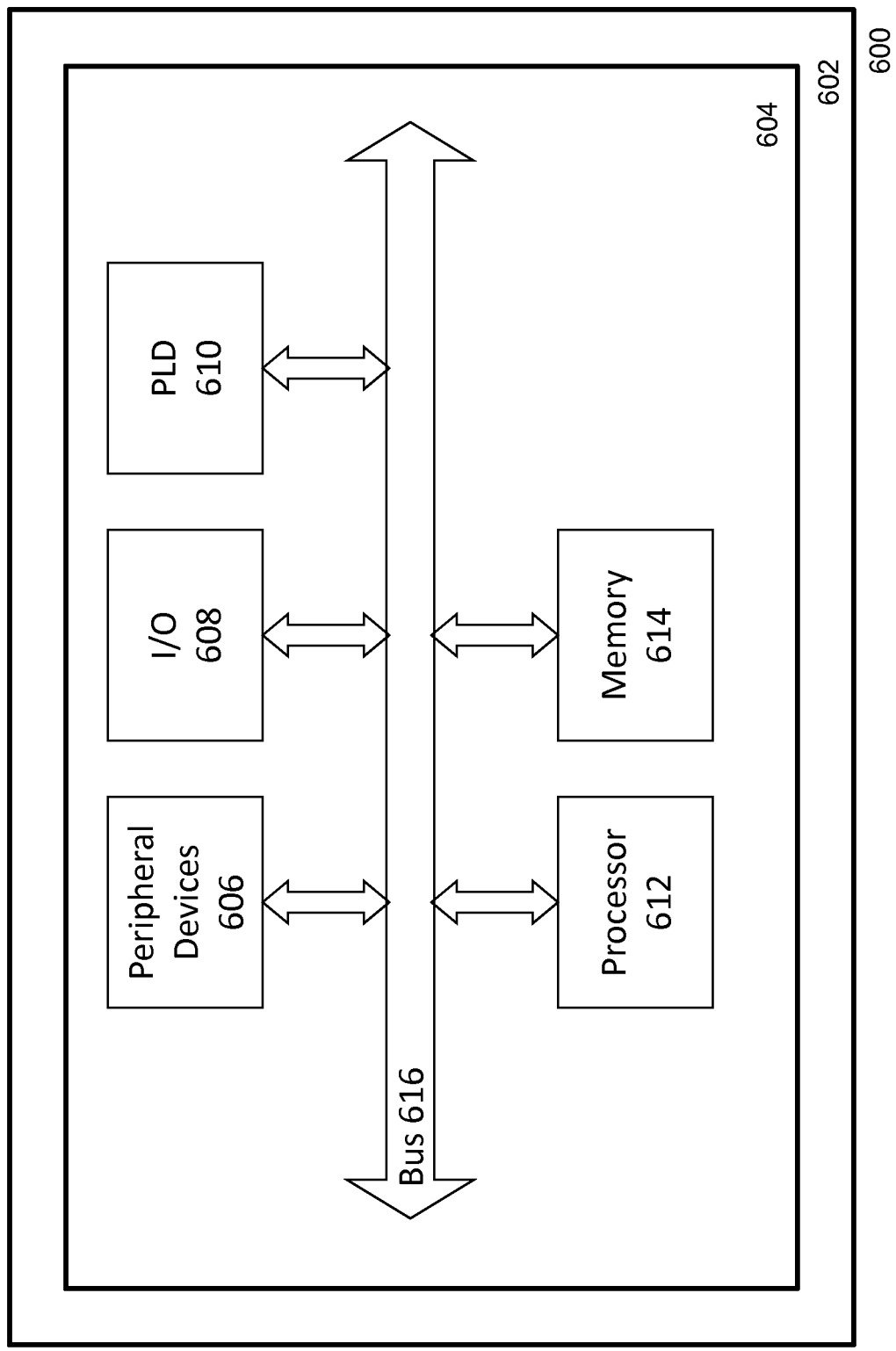
FIG. 6 is a simplified block diagram of an illustrative system employing a programmable logic device incorporating embodiments of the present invention.

An embodiment of the present invention is intended for implementation in a programmable logic device that can be implemented in a data processing system 600 such as shown in FIG. 6. Data processing system 600 may include one or more of the following components: processor 612; memory 614; I/O circuitry 608; and peripheral devices 606. These components are coupled together by system bus 616 and can be populated on circuit board 604 which is contained in end-user system 602.

System 600 can be used in a wide variety of applications, such as computer networking, data networking, instrumentation, video processing, digital signal processing, or any other application where the advantage of using programmable or reprogrammable logic is desirable. PLD 610 can be used to perform a variety of different logic functions. For example, PLD 610 can be configured as a processor or controller that works in cooperation with processor 612. PLD 610 may also be used as an arbiter for arbitrating access to a shared resource in system 600. In yet another example, PLD 610 can be configured as an interface between processor 612 and one of the other components in system 600. It should be noted that system 600 is only exemplary, and that the true scope and spirit of the invention should be indicated by the following claims.

Various technologies can be used to implement PLDs 610 as described above and incorporating this invention. And although the invention has been described in the context of PLDs, it may be used with any programmable integrated circuit device.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

It should be appreciated by those skilled in the art that the specific embodiments disclosed above may be readily utilized as a basis for modifying or designing other write elements. It should also be appreciated by those skilled in the art that such modifications do not depart from the scope of the invention as set forth in the appended claims.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed.

What is claimed is:

1. A circuit, comprising:
   a first logic core including on-die memory implemented on a programmable logic device;
   an interface bus;
   a memory controller coupled to the first logic core and the interface bus, wherein the interface bus is configured to receive memory traffic from an off-die memory and the first logic core; and
   buffer logic coupled to the interface bus implemented on the programmable logic device, wherein the buffer logic is configured to be coupled to the off-die memory and is further configured to execute a predetermined number of fast-path memory operations that includes at least one of traffic management, expedited head and tail pointer management, automated Transmission Control Protocol (TCP)/Internet Protocol (IP) error detection and correction, pattern matching, network layer error detection, and network layer error correction tasks, wherein the buffer logic resides separately from and external to the first logic core.

2. The circuit of claim 1, wherein the interface bus is configured to manage traffic between the off-die memory and the first logic core.

3. The circuit of claim 1, wherein the interface bus includes a driver circuit and a receiver circuit.

4. The circuit of claim 1, wherein the predetermined number of fast path memory operations are exclusively executed in the buffer logic.

5. The circuit of claim 1, wherein the off-die memory exclusively stores information for the fast-path memory operations.

6. The circuit of claim 5, wherein the on-die memory stores results of the fast-path memory operations.

7. The circuit of claim 1, further comprising an interposer that couples the first logic core to the first off-die memory using a plurality of through-silicon vias.

8. The circuit of claim 1, wherein the circuit is implemented in a 2.5-dimensional package.

9. The circuit of claim 1, wherein the circuit is implemented in a three-dimensional package.

10. The circuit of claim 1, wherein through-silicon vias couple the first logic core to the off-die memory.

11. The circuit of claim 1, wherein microbumps couple the first logic core to the off-die memory.

12. The circuit of claim 1, wherein the fast-path memory operations are performed on the field programmable gate array only by the buffer logic.

13. The circuit of claim 1, wherein performance of the fast-path memory operations is exclusively designated on the field programmable gate array to the buffer logic.

14. A method for handling memory operations, comprising:
   receiving memory-related information from a logic core implemented on a programmable logic device;
   receiving information from an off-die memory;
   executing a predetermined number of fast-path memory operations on the received information, wherein the fast-path memory operations include at least one of traffic management, expedited head and tail pointer management, automated Transmission Control Protocol (TCP)/Internet Protocol (IP) error detection and correction, pattern matching, network layer error detection, and network layer error correction tasks, wherein the predetermined number of fast-path memory operations are executed on buffer logic implemented on the programmable logic device residing separately from and external to the logic core;
   transmitting a first set of results of the predetermined number of fast-path memory operations to the off-die memory.

15. The method of claim 14, further comprising transmitting a second set of results of the predetermined number of fast-path memory operations to the logic core.

16. The method of claim 14, further comprising transmitting a second set of results of the predetermined number of fast-path memory operations to a first on-die memory.

17. The method of claim 14, further comprising managing traffic between the off-die memory and the logic core.

18. The method of claim 14, further comprising providing an interposer configured to couple the logic core to the first off-die memory.

19. A circuit, comprising:
   a logic core programmable to perform a plurality of functionalities implemented on a programmable logic device;
   an interface bus that receives memory traffic from an off-die memory and the logic core; and
   buffer logic, implemented on the programmable logic device and coupled to the interface bus and the off-die memory, that executes fast-path memory operations that include expedited head and tail pointer management, automated Transmission Control Protocol (TCP)/Internet Protocol (IP) error detection and correction, and pattern matching, wherein the buffer logic resides separately from and external to the logic core.

20. The circuit of claim 19, wherein the buffer logic resides in the off-die memory.

21. The circuit of claim 19, wherein the interface bus includes a driver circuit and a receiver circuit.

22. The circuit of claim 19, wherein the fast-path memory operations are exclusively executed in the buffer logic.

23. The circuit of claim 19, wherein the off-die memory exclusively stores information for the fast-path memory operations.

24. The circuit of claim 19, wherein the on-die memory stores results of the fast-path memory operations.

25. A circuit, comprising:
   a logic core programmable to perform a plurality of functionalities;
   an interface bus that receives memory traffic from an off-die memory and the logic core; and
   buffer logic, coupled to the interface bus and the off-die memory, configurable to execute fast-path memory operations that include packet processing, traffic management, deep packet inspection, expedited head and tail pointer management, automated Transmission Control Protocol (TCP)/Internet Protocol (IP) error detection and correction, pattern matching, network layer error detection, and network layer error correction tasks, wherein the buffer logic resides external to the logic core.

26. The circuit of claim 25, wherein the first logic core and the buffer logic are implemented on a field programmable gate array.

* * * * *